United States Patent
Bayan et al.

(10) Patent No.: US 7,227,245 B1
(45) Date of Patent: Jun. 5, 2007

(54) DIE ATTACH PAD FOR USE IN SEMICONDUCTOR MANUFACTURING AND METHOD OF MAKING SAME

(75) Inventors: Jaime Bayan, Palo Alto, CA (US); Santhiran Nadarajah, Melaka (MY); Chan Peng Yee, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 146 days.

(21) Appl. No.: 10/789,258

(22) Filed: Feb. 26, 2004

(51) Int. Cl.
*H01L 23/495* (2006.01)
(52) U.S. Cl. ............... 257/666; 257/676
(58) Field of Classification Search ........... 257/666, 257/672, 676, 696
See application file for complete search history.

(56) References Cited

U.S. PATENT DOCUMENTS

| 6,353,257 B1* | 3/2002 | Huang ............... 257/704 |
| 6,713,849 B2* | 3/2004 | Hasebe et al. ...... 257/667 |
| 2004/0124508 A1* | 7/2004 | Tan et al. ......... 257/675 |

* cited by examiner

*Primary Examiner*—Theresa T. Doan
(74) *Attorney, Agent, or Firm*—Beyer Weaver LLP

(57) ABSTRACT

Broadly speaking, the invention pertains to substrates for use in semiconductor manufacturing. A peripheral ledge or similar structure can be provided in a die attach pad, so as to retain adhesive that may flow from the die support surface when the die is attached to the die attach pad. In this manner, adhesive is prevented from flowing off the die attach pad, where it can create unwanted conductive areas on the outer surface of an IC package. The accompanying reduction in area of the die support surface, and retention of adhesive from any downbond areas, also prevents delamination of the adhesive.

16 Claims, 6 Drawing Sheets

DIE ATTACH PAD FOR USE IN SEMICONDUCTOR MANUFACTURING AND METHOD OF MAKING SAME

BRIEF DESCRIPTION OF THE INVENTION

This invention relates to the packaging of integrated circuits (ICs). More specifically, this invention relates to substrates for use in IC packaging.

BACKGROUND OF THE INVENTION

The drive toward miniaturization presents many challenges for the IC packaging industry. These challenges are partly addressed through use of leadless lead-frame packages (LLPs), which reduce the footprint and height of IC packages by eliminating leads that protrude from the sides of a package, instead employing contacts that are electrically exposed yet lie flush with an outer surface of the package. An LLP is a surface mounted IC package that uses a metal, usually copper, lead-frame substrate to both support the IC die and provide electrical connectivity. As illustrated in FIG. 1A and the successively more detailed FIGS. 1B and 1C, in known LLPs, a copper lead-frame strip or panel 101 is patterned, usually by stamping or etching, to define two dimensional arrays 103 of device areas 105. Each device area 105 is configured to support a semiconductor die. In the illustrated embodiment, each device area 105 includes a die attach pad 107 and a plurality of contacts 109 disposed about their associated die attach pad 107. Very fine tie bars 111 are used to support die attach pads 107 and contacts 109 during manufacturing. Although the thickness of the metal sheets from which the LLP lead-frames are made may vary, a typical thickness may be on the order of 8 mils (0.008") thick.

During assembly, IC dice are attached to respective die attach pads 107 and electrically connected to the contacts 109 using conventional wire bonding techniques. After wire bonding, a plastic encapsulant cap is molded over the top surface of each device area individually, or over each array 103. The capped dice are then cut from the array and tested using known sawing and testing techniques.

FIG. 2 illustrates a cross-section of a semiconductor die 200 after it is attached to the die attach pad 107 and bond wires 202 are bonded to the contacts 109. Commonly, an adhesive 204 such as a conductive silver-filled epoxy is deposited on the upper surface 206 of the die attach pad 107, and the die 200 is pressed onto the adhesive 204. In so doing, the die 200 is affixed to the die attach pad 107, but excess adhesive 204 may also be displaced. In some processes, the displaced portion of the adhesive 204 may be pushed completely off the die attach pad 107 where it flows down to the lower surface 208, thus creating exposed conductive areas 210 on the bottom of a packaged IC. While the amount of adhesive 204 shown, and the amount that has spilled down onto surface 208, is exaggerated for purposes of explanation, it is nevertheless a reality that the creation of conductive areas 210 is a risk. Such conductive areas risk electrical damage to the die 200, reducing process yields and creating potentially defective packages. Additionally, because the surface area of the upper surface 206 is relatively large, differences in the thermal expansion coefficients of the die 200, epoxy 204, and die attach pad 107 can result in a buildup of shear stresses along the upper surface 206. With continued thermal cycling this can sometimes result in delamination of the adhesive 204 from the die attach pad 107 and/or the die 200.

Although the prior art packaging techniques work well, there are continuing efforts to provide even further improved package designs.

SUMMARY OF THE INVENTION

Broadly speaking, the invention pertains to improved lead frame designs for use in semiconductor manufacturing. A peripheral ledge or similar structure is provided in a die attach pad. The peripheral ledge is configured to retain adhesive that may flow from the die support surface when the die is attached to the die attach pad. In this manner, adhesive is prevented from flowing off the die attach pad, where it can create unwanted conductive areas on the outer surface of an IC package. The accompanying reduction in area of the die support surface, and retention of adhesive from any downbond areas, also helps reduce the risk of delamination of the adhesive.

The invention can be implemented in numerous ways, including as a method, system, device, apparatus, and the like. Several embodiments of the invention are discussed below.

As a substrate panel for use in semiconductor packaging, one embodiment of the invention comprises a lead frame panel including a plurality of device areas, each device area having a die attach pad and a plurality of contacts, wherein each die attach pad includes a die support surface and a peripheral ledge that is recessed relative to the die support surface. A plurality of semiconductor dice are each attached to the die support surface of an associated die attach pad using an adhesive, wherein a portion of each semiconductor die extends beyond an outer edge of its associated die attach pad, and wherein the ledge is configured to retain an amount of the adhesive.

As a packaged integrated circuit, one embodiment of the invention comprises a substrate having a die attach pad and a plurality of contacts, the die attach pad having an upper surface and a peripheral ledge proximate to the upper surface. A semiconductor die is mounted on the upper surface with an adhesive, wherein a portion of the die extends beyond an outer edge of the upper surface, and wherein the peripheral area is configured to retain a portion of the adhesive so as to inhibit a flow of the adhesive from the die attach pad.

As a method of attaching a semiconductor die to a lead-frame, one embodiment of the invention comprises providing a lead-frame having a die attach pad, the die attach pad having an upper surface and a peripheral ledge proximate to the upper surface. An adhesive is applied to the upper surface of the die attach pad, and a semiconductor die is affixed to the upper surface so as to displace a portion of the adhesive from the upper surface, and so that a portion of the semiconductor die extends beyond an outer edge of the upper surface. The portion of the adhesive is retained upon the peripheral ledge.

Other aspects and advantages of the invention will become apparent from the following detailed description taken in conjunction with the accompanying drawings which illustrate, by way of example, the principles of the invention.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 3:
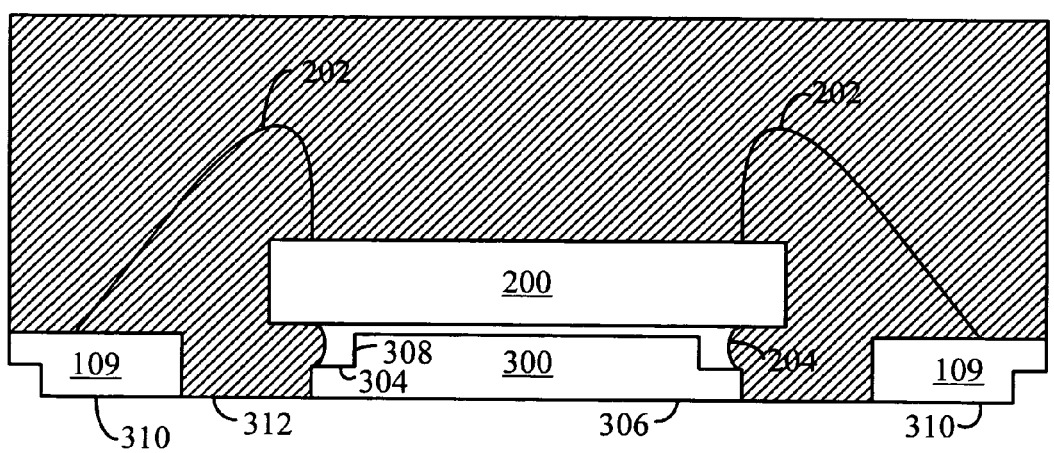
FIG. 3 illustrates a cross-section view of a lead-frame subsequent to die attach and wire bond processes, in accordance with an embodiment of the present invention.

In one embodiment, a die attach pad having a peripheral ledge for collecting any adhesive that may overflow from the upper surface of the die attach pad is described. FIG. 3 illustrates a cross-section view of an LLP package constructed in accordance with an embodiment of the present invention. A die attach pad 300 has a die support surface 302 and a peripheral ledge 304. When the die 200 is affixed to the die attach pad 300, a portion of the adhesive 204 may overflow from the upper surface 302, where it accumulates on the peripheral ledge 304 instead of flowing down toward the bottom surface 306. In this manner, the peripheral ledge 304 collects excess adhesive 204 that spills over from the upper surface 302, preventing it from flowing down off of the die attach pad 300 and creating undesired conductive areas on the outer surface of the encapsulant 312.

It can be observed that creating the ledge 304 can generally produce an upper support surface 302 having a smaller area than that of the bottom surface 306. This results in a smaller area of bonding between the upper surface 302 and the die 200. As the stresses caused by phenomena such as thermal expansion and moisture absorption are proportional to the size of the die attach area, the die attach pad 300 also helps reduce these stresses, and thus the risk of delamination. Specifically, by reducing the stresses that can build up at the interfaces between the adhesive 204 and die 200 and die attach pad 300, the risk of delamination between the adhesive 204 and die 200, or between the adhesive 204 and die attach pad 300, is reduced.

Figure 4A:
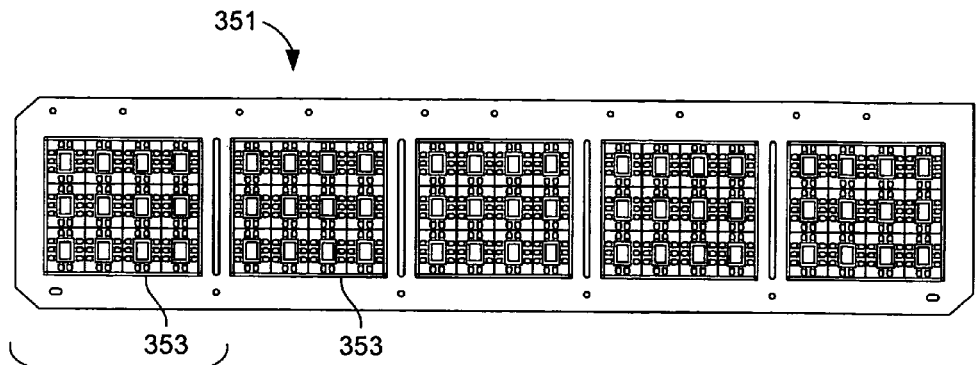
FIGS. 4A–C illustrate successively more detailed views of a lead-frame strip having features constructed in accordance with an embodiment of the present invention.
Figure 4B:
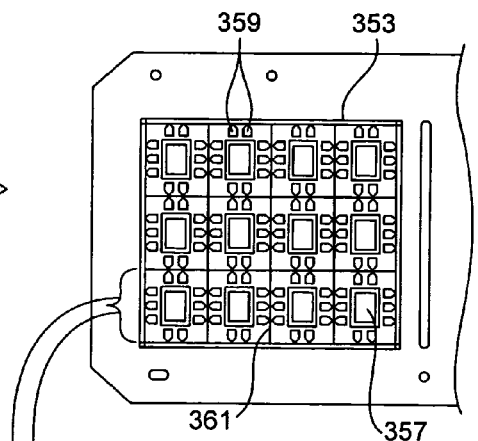
Figure 4C:
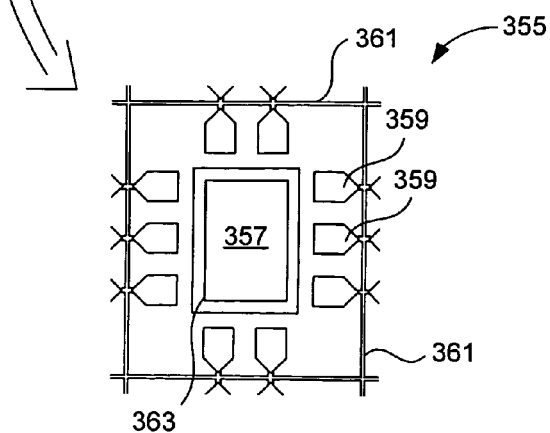

It should also be observed that the peripheral ledges 304 can be incorporated into current lead-frame strips to facilitate IC manufacturing processes. FIGS. 4A–C illustrate successively more detailed views of a lead-frame strip having die attach pads constructed as those in FIG. 3. Similar to FIGS. 1A–C, FIGS. 4A–C show a lead-frame strip or panel 351 with two-dimensional arrays 353 of device areas 355. Each device area 355 in turn includes a die attach pad 357 and a plurality of contacts 359 connected by fine tie bars 361. As discussed above, the die attach pad 357 includes a peripheral ledge along all four of its sides, forming a die support surface 363. Such a lead-frame 351 can therefore be employed in connection with known processes to produce packaged ICs incorporating advantages of the invention.

In the embodiment illustrated in FIGS. 4A–C, the peripheral ledge is provided on all four sides of the die attach pad. However, in alternative embodiments, the ledge can be provided on less than all of the sides of the die attach pad. It should be appreciated that the invention is not limited to the geometry of the peripheral ledge shown in FIGS. 3 and 4A–C. That is, while the peripheral ledge 304 is shown as a relatively flat ledge or area, the geometry of the ledge need not be so limited. Rather, the peripheral ledges of any geometry suitable for retaining an amount of adhesive 204 may be used. In this manner, the invention encompasses peripheral ledges 304 that are not flat, but rather are angled or curved.

In the embodiment illustrated in FIG. 3, the invention is implemented in the context of an LLP type package. However, it should be appreciated that the described ledges may be useful in a wide variety of other package designs as well. It should be apparent that the described ledge structure is particularly useful in packages having an exposed die attach pad such as the LLP lead-frame shown in FIG. 3. However, the invention is not limited to such embodiments. Rather, the described ledges may also be used in packages having encapsulated die attach pads.

Figure 1A:
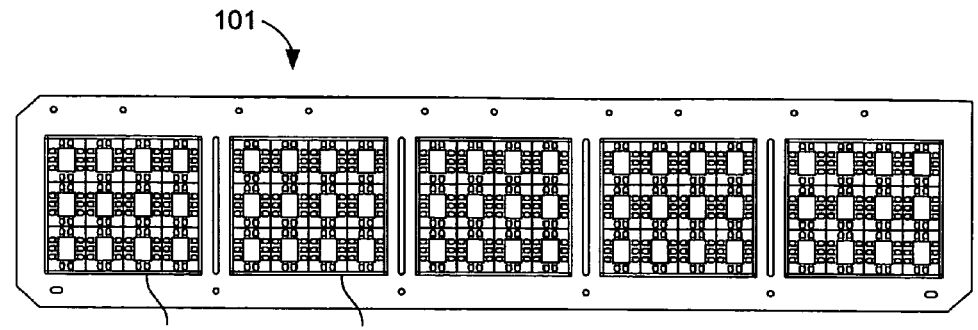
FIG. 1A illustrates a diagrammatic top view of a lead-frame strip suitable for use in packaging integrated circuits.
Figure 1B:
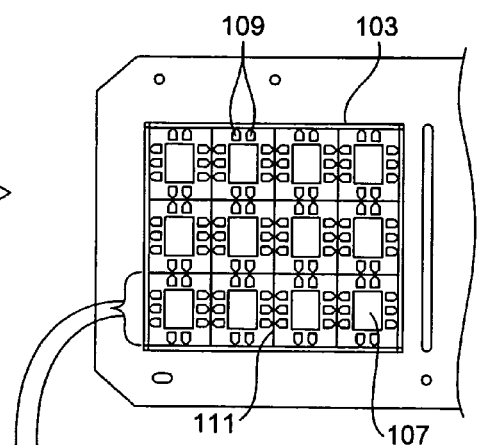
FIGS. 1B–1C illustrate successively more detailed views of selected elements of the lead-frame strip of FIG. 1A.
Figure 1C:
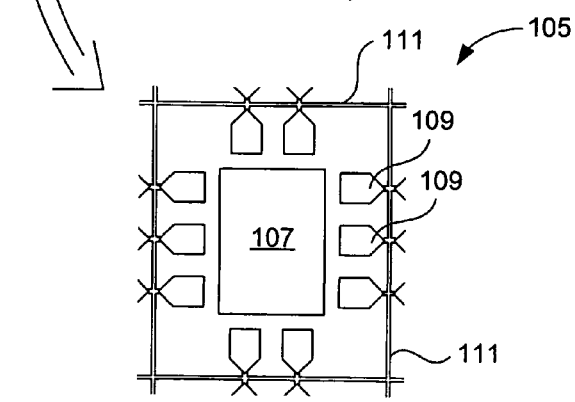
Figure 2:
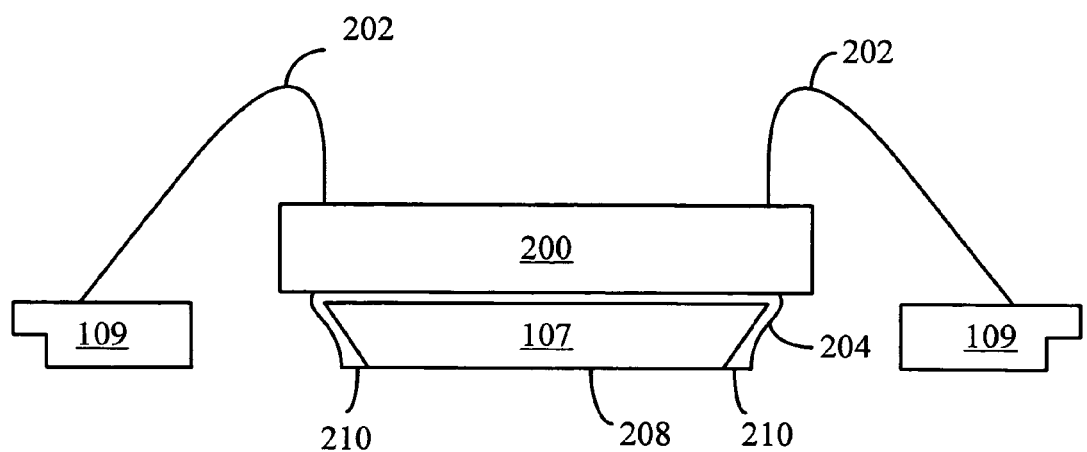
FIG. 2 illustrates a cross-section view of a prior art lead-frame subsequent to die attach and wire bond processes.
Figure 5:
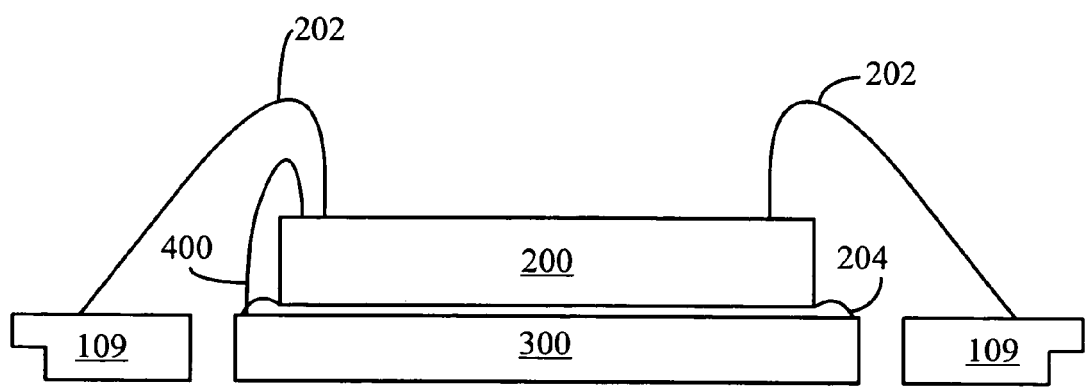
FIG. 5 illustrates a cross-section view of a prior art lead-frame in which the die is down bonded to the die attach pad.

Similarly, the invention is not limited to the retaining of adhesive simply to prevent electrically conductive areas 210 on the outer surfaces of packaged ICs. Rather, the invention can also be employed to retain adhesive so as to create more dependable and reliable down bonds. FIG. 5 illustrates a cross-section view of a prior art lead-frame in which the die is down bonded to the die attach pad. In such a configuration, the die 200 is wire bonded with bond wires 202 extending to the contacts 109 as in FIG. 2, but is also down bonded to the die attach pad 300 with a down bond 400. As can be seen, attaching the die 200 to the die attach pad 300 risks displacing an amount of the adhesive 204 to the area of the down bond 400. This not only risks compromising the integrity of the electrical connection between the down bond 400 and die attach pad 300, but also increases the risk of delamination between the adhesive 204, die attach pad 300, and down bond 400.

Figure 6:
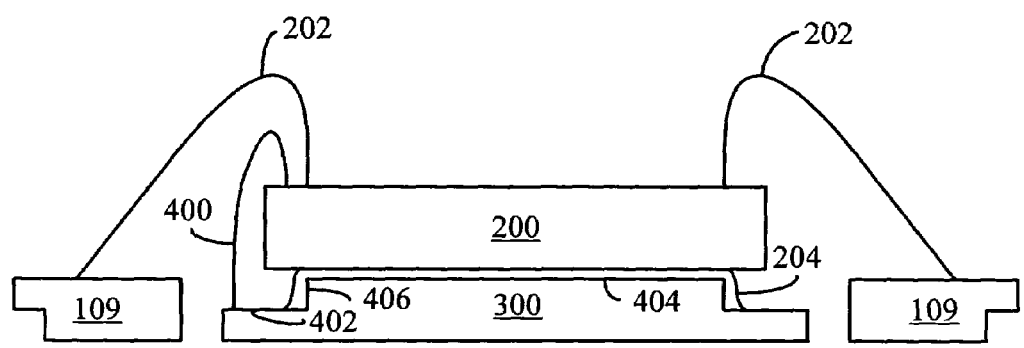
FIG. 6 illustrates a lead-frame and down-bonded die configured in accordance with an embodiment of the present invention.

By employing a peripheral area to retain adhesive 204, the invention can be employed to reduce the risk of adhesive flowing to the area of the down bond 400, and thus the risk of delamination. FIG. 6 illustrates a lead-frame and down-bonded die configured in accordance with an embodiment of the present invention. In this embodiment, the die attach pad 30 has a peripheral area 402 to which the down bond 400 is affixed. The peripheral area 402 creates additional space for excess adhesive 204. In this manner, adhesive 204 that flows from the upper surface 404 of the die attach pad 300 is retained relatively close to the outer edge 406, and away from the down bond 400. The presence of the peripheral ledge 402 thus retains a portion of the adhesive 204, inhibiting any flow toward the down bond 400.

The fabrication of lead-frames such as those shown in FIGS. 3 and 6 is accomplished by known process steps. Namely, die attach pads 300 are fabricated according to known steps, and the peripheral areas 304, 402 are carved out according to known masking and etching processes. It is often convenient to fabricate the peripheral areas 304, 402 by known half-etching processes, however the invention encompasses any process for carving out peripheral areas 304, 402, such as stamping. A lead-frame panel can thus be fabricated in which each device area includes these peripheral portions 304, 402. Once the lead-frame is fabricated, semiconductor dice can be attached and packaged. An amount of adhesive 204 is then applied to each die attach pad 300, and dice 300 are affixed to the die attach pad 300. If any excess adhesive 204 flows off the upper surfaces 302, 404 of the die attach pads 300, it is retained on the peripheral portions 304, 402, and prevented from either flowing into the area of down bonds 400, or off the die attach pads 300 completely.

Once the dice have been attached and properly wirebonded and/or downbonded, encapsulant can be applied to form a completed IC package. As the peripheral areas 304, 402 have caught and retained any excess adhesive 204 that has flowed from the die support surfaces 302, 404, no unwanted conductive areas such as conductive areas 201 will exist on the outer surface of the encapsulant. Specifically, in the LLP context, it can be seen that the bottom surfaces 306, 310 of the die attach pad 300 and contacts 109 remain the only exposed and electrically conductive surfaces.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It should be apparent that many modifications and variations are possible in view of the above teachings. For example, as described above, the invention is not limited to the LLP context, but instead can be utilized to retain adhesive in many different packages. Similarly, the invention is not limited to the half-etching of flat ledges located near the periphery of a die attach pad, but in fact includes the fabrication of any die attach pad structure suitable for retaining an amount of die attach adhesive. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A substrate panel for use in semiconductor packaging, the substrate panel comprising:
   a lead frame panel having a top surface and a bottom surface, the panel including a plurality of device areas, each device area having a die attach pad and a plurality of contacts, wherein each die attach pad includes a die support surface and a uniform peripheral ledge that is recessed relative to the die support surface wherein the uniformly recessed peripheral ledges extend around the outer edges of the die attach pads, wherein the die support surface is formed on the top surface and is coplanar with top surfaces of the plurality of contacts; and
   a plurality of semiconductor dice, each die being attached to the die support surface of an associated die attach pad using an adhesive, wherein a portion of each semiconductor die extends beyond an outer edge of its associated die attach pad, and wherein the ledge is configured to retain an amount of the adhesive.

2. The substrate panel of claim 1 wherein the devices areas are sized so that the area of the die attach surface formed on the top surface is less than the area of the bottom surface of the die attach pad.

3. A substrate panel as recited in claim 1 wherein bottom surfaces of the contacts are substantially co-planar with bottom surfaces of the die attach pads.

4. A substrate panel as recited in claim 3 further comprising an encapsulant applied to the lead frame panel, wherein the second surfaces of the die attach pads and the bottom surfaces of the contacts are exposed on an outer surface of the encapsulant, and wherein the peripheral ledges retain amounts of the adhesive so as to prevent the adhesive from being exposed on the outer surface of the encapsulant.

5. The substrate panel of claim 1 wherein at least some of the semiconductor dice are down bonded to the respective ledges of their associated die attach pads.

6. The substrate panel of claim 1 wherein the lead frame panel comprises a matrix of tie bars arranged in perpendicular rows and columns that define a two dimensional array of the device areas such that adjacent device areas are separated only by the tie bars.

7. The substrate panel of claim 1 wherein the die support surfaces are adapted to receive semiconductor die in a manner so that for each device area a bottom surface of a die is adhered to the top surface of the panel at the die support surface, and wherein the opposing top surface of the die is wired bonded to the plurality of contacts of the device area so that a wire connection extends from the top surfaces of the plurality of contacts to the top surface of the die to form a wire bonded connection.

8. A packaged integrated circuit, comprising:
   a substrate having a top surface and a bottom surface, the substrate having a die attach pad and a plurality of contacts, the die attach pad top surface includes a uniformly recessed peripheral ledge located proximate to, and surrounding, an outer edge of the top surface and configured such that the uniformly recessed peripheral ledge extends to an outer edge of the die attach pad, wherein the top surface of the die attach pad is coplanar with top surfaces of the plurality of contacts;
   a semiconductor die mounted on the top surface with an adhesive;
   wherein a portion of the die extends beyond an outer edge of the top surface; and
   wherein the peripheral ledge is configured to retain a portion of the adhesive so as to inhibit a flow of the adhesive from the die attach pad.

9. The integrated circuit of claim 8 wherein the peripheral ledge is configured so that the area of the top surface of the die attach pad smaller than a bottom surface of the die attach pad.

10. The integrated circuit of claim 8 wherein bottom surfaces of the contacts are substantially co-planar with bottom surfaces of the die attach pad.

11. The integrated circuit of claim 10 further comprising an encapsulant applied to the substrate and the semiconductor die, wherein a lower surface of the die attach pad is exposed on an outer surface of the encapsulant, and wherein the peripheral ledge retains an amount of the adhesive so as to prevent the adhesive from being exposed on the outer surface of the encapsulant.

12. The integrated circuit of claim 8 wherein the die is down bonded to the peripheral area.

13. The packaged integrated circuit of claim 8 wherein a bottom surface of the semiconductor die is mounted to the top surface of the substrate with the adhesive and
   wherein a top surface of the die is wired bonded to the plurality of contacts of the substrate so that a wire connection extends from the top surfaces of the plurality of contacts to the top surface of the die to form a wire bonded connection.

14. A substrate panel for use in semiconductor packaging, the substrate panel comprising:
   a lead frame panel having a top surface and a bottom surface, the panel including,
   a plurality of device areas, each device area having a plurality of contacts arranged around a die attach pad so that the top surface of the die attach pad is substantially coplanar with top surfaces of the plurality of contacts,
   each die attach pad includes a die support surface and a recessed ledge portion that is lower than the die support surface, the recessed ledge portion extends uniformly to an edge of the die attach pad and extends uniformly around all of the outer edges of its associated die attach pad, and
   further configured so that a plurality of semiconductor dice are attached to the die support surface of each die attach pad using an adhesive layer, wherein a portion of each semiconductor die extends beyond an outer edge of its associated die attach pad, and wherein the ledge portion is configured to retain an amount of the adhesive.

15. The substrate panel of claim 14 wherein each of the semiconductor dies are electrically connected with the plurality of contacts arranged around the die and wherein each die and associated electrical connections to the contacts are encapsulated.

16. The substrate panel of claim 15 wherein a top surface of each of the semiconductor dies are electrically connected with the top surface of the plurality of contacts by wired bonded electrical connections that are wire bonded to the top surface of the dies and to the top surface of associated contacts.

* * * * *

UNITED STATES PATENT AND TRADEMARK OFFICE
CERTIFICATE OF CORRECTION

| | | |
|---|---|---|
| PATENT NO. | : 7,227,245 B1 | Page 1 of 1 |
| APPLICATION NO. | : 10/789258 | |
| DATED | : June 5, 2007 | |
| INVENTOR(S) | : Jaime Bayan et al. | |

It is certified that error appears in the above-identified patent and that said Letters Patent is hereby corrected as shown below:

On the Title Page of the Patent:

(75) Inventors: Change the third inventor's name from "Chan Peng Yee" to --Chang Peng Yeen--.

Signed and Sealed this

Eighth Day of June, 2010

David J. Kappos
*Director of the United States Patent and Trademark Office*